United States Patent
Moon et al.

(10) Patent No.: US 7,675,071 B2
(45) Date of Patent: Mar. 9, 2010

(54) LIGHT EMITTING TRANSISTOR

(75) Inventors: Won Ha Moon, Suwon (KR); Chang Hwan Choi, Seongnam (KR); Hyun Jun Kim, Suwon (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 124 days.

(21) Appl. No.: 11/878,680

(22) Filed: Jul. 26, 2007

(65) Prior Publication Data

US 2008/0116465 A1    May 22, 2008

(30) Foreign Application Priority Data

Nov. 17, 2006    (KR) .................. 10-2006-0113886

(51) Int. Cl.
*H01L 27/15* (2006.01)
*H01L 29/26* (2006.01)
*H01L 31/12* (2006.01)
*H01L 33/00* (2006.01)

(52) U.S. Cl. ........................................ 257/79

(58) Field of Classification Search ............. 257/103, 257/116–117, 432–437, 457, 459, 749, E33.056–E33.059, 257/E25.032, 81, 82, 91, 98, 99, 100, 13, 257/53, 79; 438/775–777, 51, 55, 64–68, 438/83, 98; 977/759, 742, 790, 825

See application file for complete search history.

(56) References Cited

U.S. PATENT DOCUMENTS

| 4,707,216 | A  | * | 11/1987 | Morkoc et al. .............. 117/105 |
| 6,646,282 | B1 | * | 11/2003 | Chen ........................... 257/10 |
| 6,891,191 | B2 | * | 5/2005  | Xiao et al. .................... 257/40 |
| 7,132,677 | B2 | * | 11/2006 | Kim et al. ..................... 257/14 |
| 2007/0201523 | A1 | * | 8/2007 | Walter et al. ............. 372/43.01 |

FOREIGN PATENT DOCUMENTS

| JP | 2005-197612    | 7/2005  |
| KR | 10-2005-0001582 | 1/2005  |
| KR | 10-2005-0098540 | 10/2005 |
| KR | 10-2005-0116925 | 12/2005 |

OTHER PUBLICATIONS

Y. Zhang et al., "Heterostructures of Singlewalled carbon Nanotubes and Carbide Nanorods", Science Magazine, Sep. 1999, pp. 1719-1722.*

* cited by examiner

*Primary Examiner*—Dao H Nguyen
*Assistant Examiner*—Tram H Nguyen
(74) *Attorney, Agent, or Firm*—McDermott Will & Emery LLP

(57) ABSTRACT

Provided is a light emitting transistor comprising a first conductivity-type collector layer formed on a substrate; a second conductivity-type base layer formed on the collector layer; and a first conductivity-type emitter layer formed on the base layer. At least one of the collector layer, the base layer, and the emitter layer has a nanorod structure with a plurality of nanorods.

8 Claims, 4 Drawing Sheets

[FIG. 1]
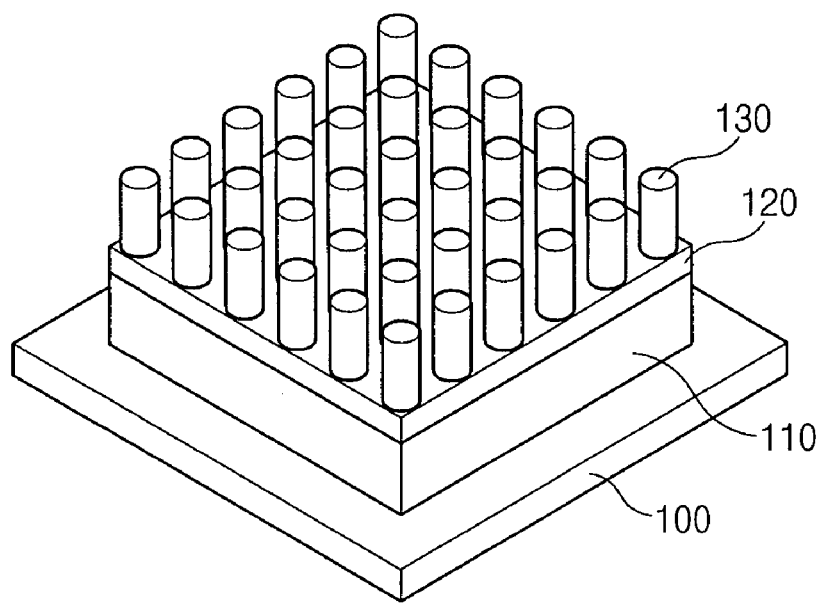
[FIG. 2A]
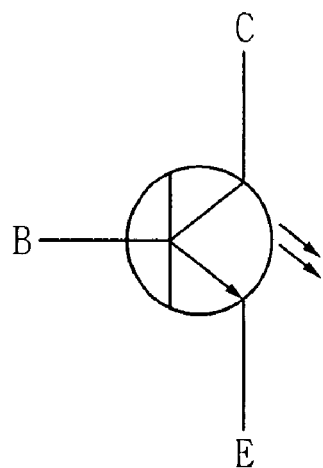
[FIG. 2B]
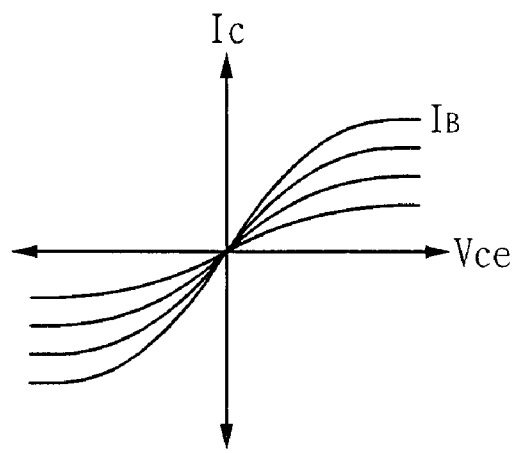

[FIG. 3]
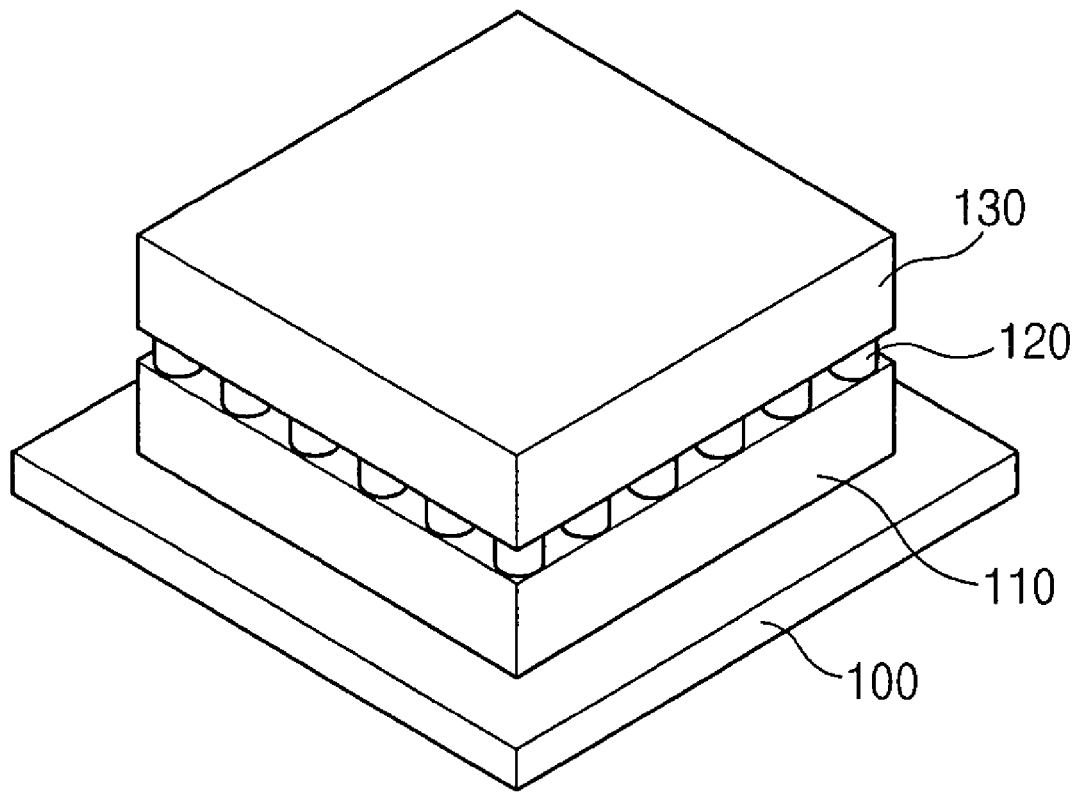
[FIG. 4]
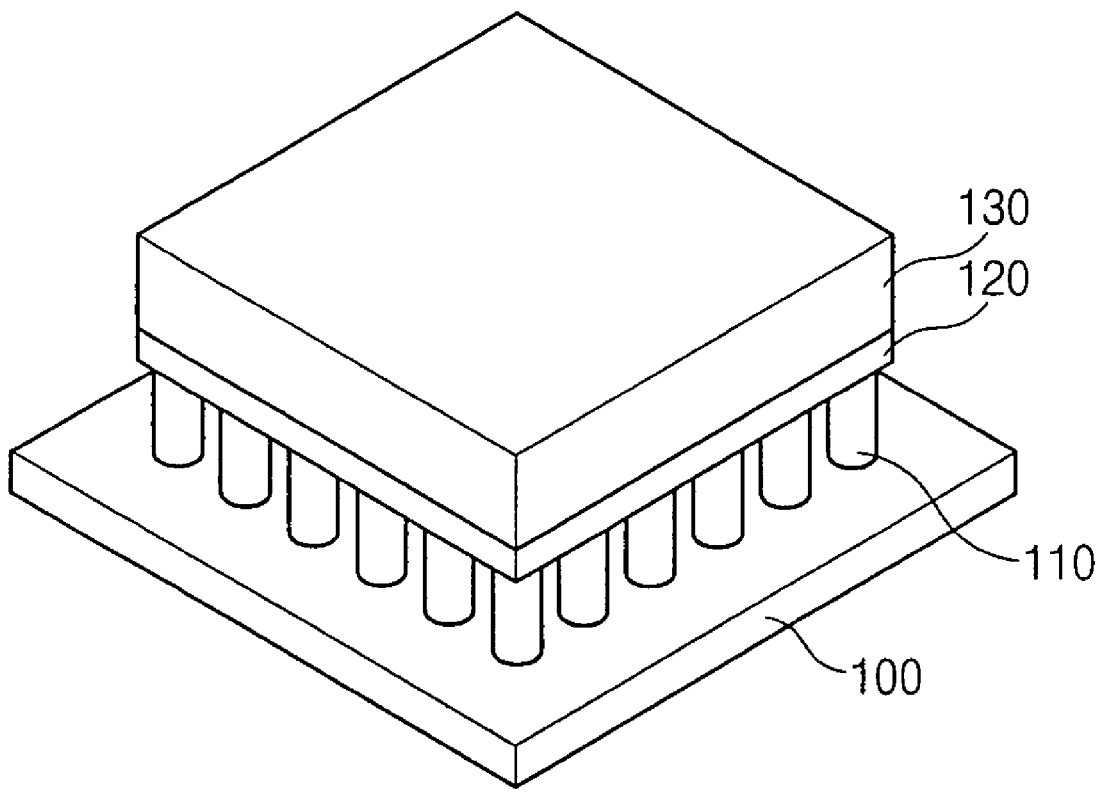

[FIG. 5]
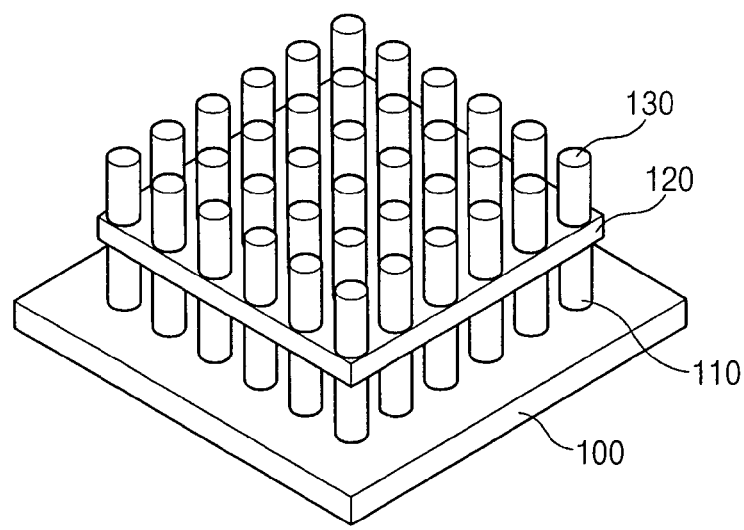
[FIG. 6]
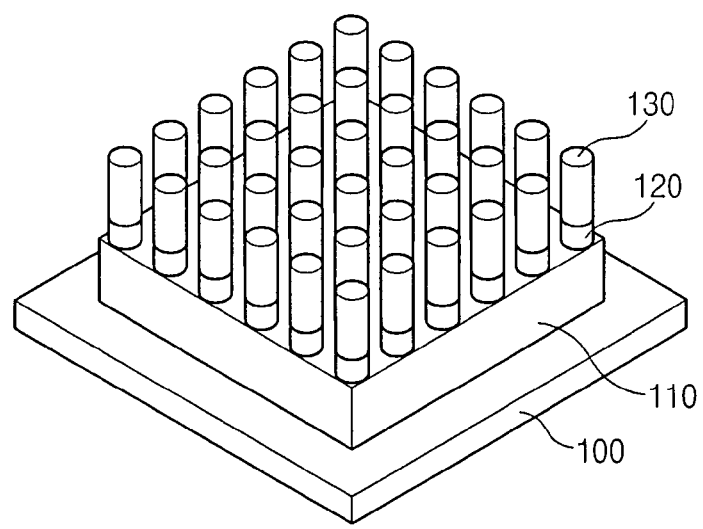
[FIG. 7]
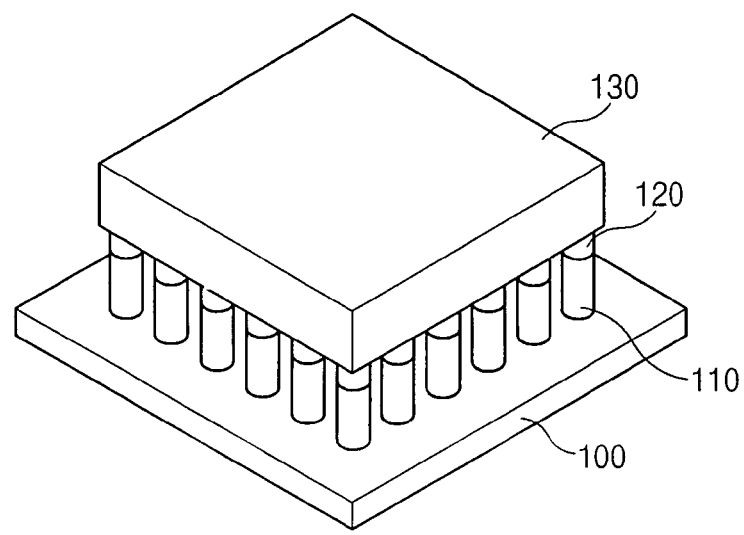

[FIG. 8]
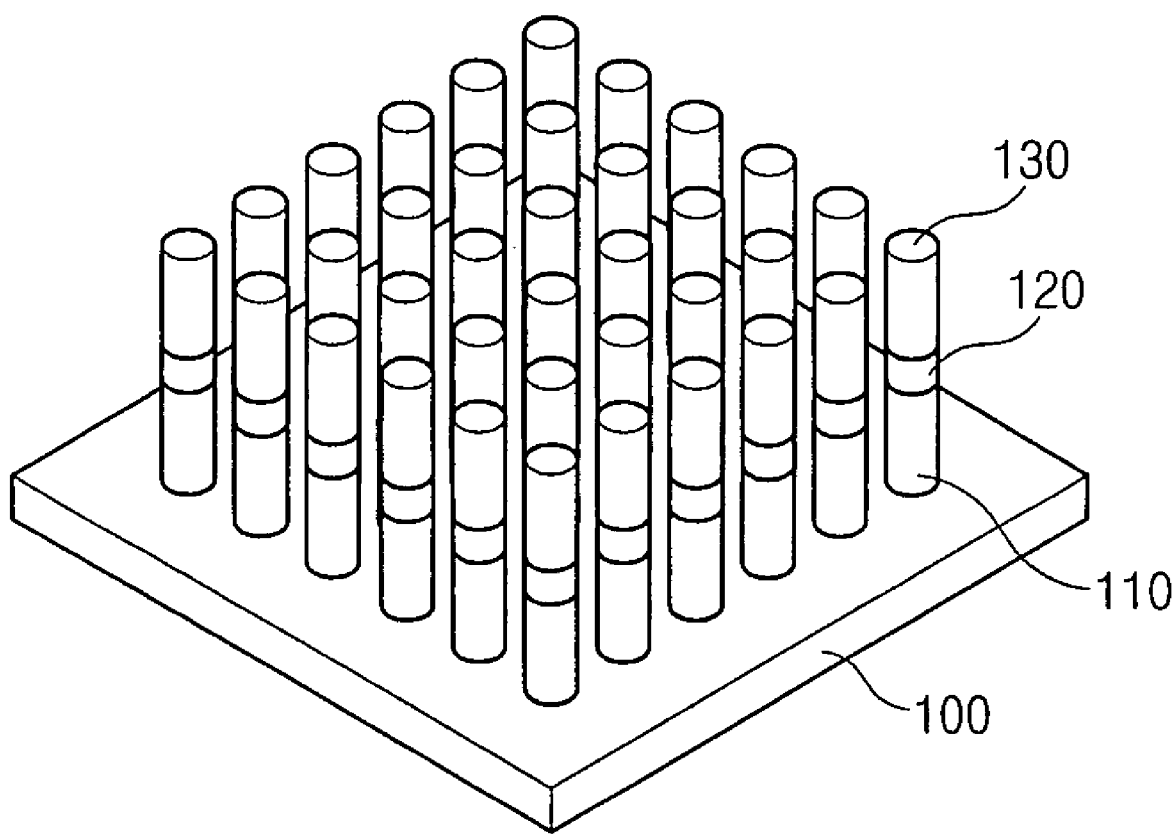

LIGHT EMITTING TRANSISTOR

CROSS-REFERENCE TO RELATED APPLICATIONS

This application claims the benefit of Korean Patent Application No. 10-2006-0113886 filed with the Korean Intellectual Property Office on Nov. 17, 2005, the disclosure of which is incorporated herein by reference.

BACKGROUND OF THE INVENTION

1. Field of the Invention

The present invention relates to a light emitting transistor with a nano structure which can amplify and switch optical and electrical characteristics.

2. Description of the Related Art

In general, a light emitting diode (LED) generates minority carriers (electrons or holes) injected by using the p-n junction structure of a semiconductor, and recombines the minority carriers so as to emit light. In other words, if a forward voltage is applied to a specific element of semiconductor, electrons and holes are recombined while moving through the junction between an anode and a cathode. Since energy in such a state is smaller than energy in a state where the electrons and holes are separated, light is emitted due to a difference in energy occurring at this time.

Such an LED can irradiate light with high efficiency by using a low voltage. Therefore, the LED is used in a home appliance, a remote control, an electronic display board, a marker, an automation equipment and the like.

Meanwhile, most of semiconductor electronic elements are implemented with transistors, and transistors formed of group III-V and II-VI nitride semiconductors are manufactured and are used in various fields.

However, researches about transistors for light emission have almost never carried out. In this technical field, a new method for amplifying and switching optical and electrical characteristics is being required.

SUMMARY OF THE INVENTION

An advantage of the present invention is that it provides a light emitting transistor with a nano structure which can amplify and switch optical and electrical characteristics.

Additional aspect and advantages of the present general inventive concept will be set forth in part in the description which follows and, in part, will be obvious from the description, or may be learned by practice of the general inventive concept.

According to an aspect of the invention, a light emitting transistor comprises a first conductivity-type collector layer formed on a substrate; a second conductivity-type base layer formed on the collector layer; and a first conductivity-type emitter layer formed on the base layer. At least one of the collector layer, the base layer, and the emitter layer has a nanorod structure with a plurality of nanorods.

The first conductivity type may n-type, and the second conductivity type may be p-type. Alternately, the first conductivity type may be p-type, and the second conductivity type may be n-type.

Preferably, the collector layer, the base layer, and the emitter layer are formed of group II-VI or II-V compound semiconductors.

Preferably, the light emitting transistor further comprises an activation layer formed at the interface between the collector layer and the base layer or at the interface between the base layer and the emitter layer.

Preferably, the activation layer has a nanorod structure with a plurality of nanorods and is formed of a group II-VI or II-V compound semiconductor.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a perspective view illustrating the structure of a light emitting transistor according to an embodiment of the invention;

FIG. 2A is a diagram showing an equivalent circuit of the light emitting transistor according to an embodiment of the invention;

FIG. 2B is a diagram showing an I-V curve of the light emitting transistor; and

FIGS. 3 to 8 are perspective views illustrating modifications of the light emitting transistor according to an embodiment of the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures. In the drawings, the thicknesses of layers and regions are exaggerated for clarity.

Hereinafter, a light emitting transistor according to an embodiment of the present invention will be described in detail with reference to the accompanying drawings.

FIG. 1 is a perspective view illustrating the structure of a light emitting transistor according to an embodiment of the invention.

As shown in FIG. 1, the light emitting transistor according to the invention basically has a bipolar junction structure.

That is, the light emitting transistor includes a substrate 100, a first conductivity-type collector layer 110 formed on the substrate, a second conductive-type base layer 120 formed on the collector layer 110, and a first conductivity-type emitter layer 130 formed on the base layer 120, the first conductivity-type emitter layer 130 having the same conductivity type as the first conductivity-type collector layer 110.

The collector layer 110, the base layer 120, and the emitter layer 130 may be formed of group II-VI or III-V compound semiconductors. As for the group II-VI compound semiconductors, ZnSe, ZnTe, ZnSeTe, ZnS, ZnO, CdSe, CdS, CdTe, ZnCdS, ZnCdSe, ZnCdSeTe, ZnCdSTe and the like can be used. As for the group III-V compound semiconductors, GaAs, GaAlAs, GaInAs, InAs, InP, InSb, GaSb, GaInSb, GaN, GaInN and the like can be used.

The first conductivity type is n-type, and the second conductivity type is p-type. The collector layer 110 and the emitter layer 130 may be formed of n-type semiconductors, and the base layer 120 may be formed of a p-type semiconductor. The n-type semiconductor may be doped with Si, Se, Sn or the like, and the p-type semiconductor may be doped with Mg, Zn, Be or the like.

On the contrary, the first conductivity type may be p-type, and the second conductivity type may be n-type. Further, the collector layer 110 and the emitter layer 130 may be formed of p-type semiconductors, and the base layer 120 may be formed of an n-type semiconductor.

The emitter layer 130 is a region to which holes or electrons are injected, the collector layer 110 is a region in which the injected holes or electrons are focused, and the base layer 120 is an intermediate region between the emitter layer 130 and the collector layer 110.

At least one of the collector layer 110, the base layer 120, and the emitter layer 130 has a nanorod structure with a plurality of nanorods.

As such, when at least one of the collector layer 110, the base layer 120, and the emitter layer 130 has a nanorod structure, which is a low-dimensional nano-structure such as a quantum point and a quantum well, electrons within the nanorod structure can be effectively captured, and light emission efficiency by recombination can be enhanced.

FIG. 1 shows a state where the emitter layer 130 among the collector layer 110, the base layer 120, and the emitter layer 130 has a nanorod structure with a plurality of nanorods.

FIGS. 3 to 8 are perspective views illustrating modifications of the light emitting transistor according to an embodiment of the invention. FIG. 3 shows a state where the base layer 120 among the collector layer 110, the base layer 120, and the emitter layer 130 has a nanorod structure with a plurality of nanorods. FIG. 4 shows a state where the collector layer 110 among the collector layer 110, the base layer 120, and the emitter layer 130 has a nanorod structure with a plurality of nanorods. FIG. 5 shows a state where the collector layer 110 and the emitter layer 130 among the collector layer 110, the base layer 120, and the emitter layer 130 has a nanorod structure with a plurality of nanorods. FIG. 6 shows a state where the base layer 120 and the emitter layer 130 among the collector layer 110, the base layer 120, and the emitter layer 130 have a nanorod structure with a plurality of nanorods. FIG. 7 shows a state where the collector layer 110 and the base layer 120 among the collector layer 110, the base layer 120, and the emitter layer 130 have a nanorod structure with a plurality of nanorods. FIG. 8 shows a state where all of the collector layer 110, the base layer 120, and the emitter layer 130 have a nanorod structure with a plurality of nanorods.

Although not shown, the light emitting transistor according to the invention further includes an activation layer formed at the interface between the collector layer 110 and the base layer 120 or between the base layer 120 and the emitter layer 130. That is, the activation layer may be formed at the interface between the collector layer 110 and the base layer 120 and at the interface between the base layer 120 and the emitter layer 130. Alternately, the activation layer may be formed only at the interface between the collector layer 110 and the base layer 120 or only at the interface between the base layer 120 and the emitter layer 130. The activation layer as well as the collector layer 110, the base layer 120, and the emitter layer 130 may be formed of group II-VI or III-V compound semiconductors.

FIG. 2A is a diagram showing an equivalent circuit of the light emitting transistor according to an embodiment of the invention, and FIG. 2B is a diagram showing an I-V curve of the light emitting transistor.

Referring to FIGS. 2A and 2B, the light emitting transistor including three terminals of a collector C, a base B, and an emitter E can adjust the intensity of light generated from the activation layer by the adjustment of the base B, and the magnitude of a collector current is adjusted by a base voltage.

That is, carriers flowing in the emitter E and the collector C are electrons and holes. When a voltage is applied to the base B, the barrier of the base B is reduced in height such that carriers easily move from the emitter E to the collector C. Then, a current flowing in the collector C is amplified.

As described above, the light emitting transistor according to the invention has a bipolar junction structure including the collector layer 110, the base layer 120, and the emitter layer 130. Further, at least one of the collector layer 110, the base layer 120, and the emitter layer 130 is formed with a nanorod structure with a plurality of nanorods. Therefore, an optical and electrical output can be amplified or can be switched from on-state to off-state or from off-state to on-state, in accordance with the bias direction of each terminal.

According to the invention, the light emitting transistor has a bipolar junction structure including the collector layer, the base layer, and the emitter layer. Further, at least one of the collector layer, the base layer, and the emitter layer is formed with a nanorod structure with a plurality of nanorods. Therefore, it is possible to obtain optical and electrical characteristics at the same time.

Further, the intensity of light can be adjusted by the adjustment of the base terminal, and an optical and electrical output can be amplified or can be switched from on-state to off-state or from off-state to on-state, in accordance with the bias direction of each terminal.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A light emitting transistor comprising:
   a first conductivity-type collector layer formed on a substrate;
   a second conductivity-type base layer formed on the collector layer; and
   a first conductivity-type emitter layer formed on the base layer,
   wherein at least one of the collector layer, the base layer, and the emitter layer has a nanorod structure with a plurality of nanorods as low-dimensional nanostructure, wherein the light emitting transistor has a bipolar junction structure, and is amplified or is switched in accordance with a bias direction of each layer.

2. The light emitting transistor according to claim 1, wherein the first conductivity type is n-type, and the second conductivity type is p-type.

3. The light emitting transistor according to claim 1, wherein the first conductivity type is p-type, and the second conductivity type is n-type.

4. The light emitting transistor according to claim 1, wherein the collector layer, the base layer, and the emitter layer are formed of group II-VI or III-V compound semiconductors.

5. The light emitting transistor according to claim 1 further comprising
   an activation layer formed at the interface between the collector layer and the base layer.

6. The light emitting transistor according to claim 1 further comprising
   an activation layer formed at the interface between the base layer and the emitter layer.

7. The light emitting transistor according to claim 5, wherein the activation layer has a nanorod structure with a plurality of nanorods.

8. The light emitting transistor according to claim 7, wherein the activation layer is formed of a group II-VI or II-V compound semiconductor.

* * * * *